US009991144B2

(12) United States Patent
Adachi et al.

(10) Patent No.: US 9,991,144 B2
(45) Date of Patent: Jun. 5, 2018

(54) STORAGE WAREHOUSE

(71) Applicant: MURATA MACHINERY, LTD., Kyoto-shi, Kyoto (JP)

(72) Inventors: Naruto Adachi, Inuyama (JP); Yasuhisa Ito, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 164 days.

(21) Appl. No.: 15/025,727

(22) PCT Filed: Aug. 26, 2014

(86) PCT No.: PCT/JP2014/072284
§ 371 (c)(1),
(2) Date: Mar. 29, 2016

(87) PCT Pub. No.: WO2015/045711
PCT Pub. Date: Apr. 2, 2015

(65) Prior Publication Data

US 2016/0247702 A1 Aug. 25, 2016

(30) Foreign Application Priority Data

Sep. 30, 2013 (JP) ................................ 2013-203912

(51) Int. Cl.
*H01L 21/67* (2006.01)
*H01L 21/677* (2006.01)
(Continued)

(52) U.S. Cl.
CPC ...... *H01L 21/67769* (2013.01); *B65G 1/0457* (2013.01); *B65G 1/0485* (2013.01);
(Continued)

(58) Field of Classification Search
CPC ......... H01L 21/67769; H01L 21/67766; H01L 21/67775; B65G 1/0457; B65G 1/137; B65G 1/0485
See application file for complete search history.

(56) References Cited

U.S. PATENT DOCUMENTS 8,560,114 B2 * 10/2013 Suess .................... B65G 1/137 700/216
8,694,154 B2 * 4/2014 Winkler ................ B65G 1/137 700/213

(Continued)

FOREIGN PATENT DOCUMENTS

CN 101480796 A 7/2009
JP 06-115615 A 4/1994

(Continued)

OTHER PUBLICATIONS

English translation of Official Communication issued in corresponding International Application PCT/JP2014/072284, dated Apr. 5, 2016.

(Continued)

*Primary Examiner* — Kaitlin S Joerger
(74) *Attorney, Agent, or Firm* — Keating & Bennett, LLP

(57) ABSTRACT

A storage warehouse includes shelves, wherein first and second containers capable of being transported while placed on an attachment are stored; a warehouse-in port and a warehouse-out port whereon the first and second containers placed on the attachment are placed; a warehouse-in conveyor and a warehouse-out conveyor that convey the first and second containers placed on the attachment between the shelves, and the warehouse-in port and between the shelves, and the warehouse-out port; an attachment-use warehouse-in/out port that temporarily stores the attachment; and a transfer machine that is capable of transferring the attachment between the attachment-use warehouse-in/out port and the warehouse-in port and between the attachment-use warehouse-in/out port and the warehouse-out port.

12 Claims, 21 Drawing Sheets

31 33 32 32A 32B 32C 33A 33B 33C 24 73 71 21 20 32D 32E 23 22 33D 33E 33F 12(11) 33G 33H 32F 33I 33J 33K 82(81)

(51) Int. Cl.

| | |
|---|---|
| ***B65G 1/04*** | (2006.01) |
| ***B65G 1/137*** | (2006.01) |
| ***B65G 57/03*** | (2006.01) |
| ***H01L 21/673*** | (2006.01) |

(52) U.S. Cl.

CPC ............. *B65G 1/137* (2013.01); *B65G 57/03* (2013.01); *H01L 21/67389* (2013.01); *H01L 21/67766* (2013.01); *H01L 21/67775* (2013.01)

(56) References Cited

U.S. PATENT DOCUMENTS

| | | | | |
|---|---|---|---|---|
| 9,139,363 | B2 * | 9/2015 | Lert | B65G 1/0492 |
| 9,327,397 | B1 * | 5/2016 | Williams | B25J 3/00 |
| 9,725,242 | B2 * | 8/2017 | Issing | B65G 1/1378 |
| 2007/0284217 | A1 | 12/2007 | Ito | |
| 2008/0269960 | A1 * | 10/2008 | Kostmann | B65G 1/0407 701/2 |
| 2014/0305540 | A1 * | 10/2014 | Oyama | H01L 21/67389 141/4 |
| 2016/0107838 | A1 * | 4/2016 | Swinkels | B66F 9/063 414/273 |
| 2016/0355339 | A1 * | 12/2016 | Peng | B65G 1/0457 |

FOREIGN PATENT DOCUMENTS

| | | | |
|---|---|---|---|
| JP | 2003-142551 | A | 5/2003 |
| JP | 2007-287877 | A | 11/2007 |

OTHER PUBLICATIONS

Official Communication issued in International Patent Application No. PCT/JP2014/072284, dated Nov. 25, 2014.

* cited by examiner

STORAGE WAREHOUSE

BACKGROUND OF THE INVENTION

1. Field of the Invention

The present invention relates to a storage warehouse that is capable of storing together multiple types of articles having differing sizes.

2. Description of the Related Art

A known storage warehouse includes a plurality of storage shelves and a stacker crane that transfers articles to each storage shelf. In addition, a known transport system includes an unattended transport vehicle that, between a warehouse-in port and a warehouse-out port provided in the storage warehouse, enters articles into a warehouse and removes articles from the warehouse. Among such transport systems, there is one that attempts to accurately transfer the articles by positioning the articles during transport or during storage.

For example, a storage container called a Front Opening UnifiedPod (FOUP), which is capable of housing a plurality of substrates such as semiconductor wafers, can be described as an article handled in the storage warehouse or transport system as discussed above. Such a storage container is used principally inside a facility, such as a manufacturing plant wherein a transport system is installed, in order to transport or temporarily store a plurality of semiconductor wafers between multiple processes or within each process along the pathway of the transport vehicle (e.g., refer to JP 2007-287877).

In the storage container that houses substrates such as semiconductor wafers, engaging grooves (or holes) for positioning are formed in order to accurately deliver the substrates to the various manufacturing apparatuses. In this case, the transport apparatus, such as a stacker crane for transporting the storage container, the storage shelves of the storage warehouse, and the like are provided with positioning pins, which engage with the engaging grooves and the like, thus making it possible both to restrict the shifting of the position of the storage container during storage or transport and to accurately transfer the storage container to the storage shelf, etc., of the automated warehouse, etc.

The storage containers differ in size in accordance with the size of the substrates to be stored, and the arrangement of the engaging grooves is set in advance in accordance with the sizes of the storage containers. Accordingly, if the sizes of the storage containers differ, then the arrangement of the grooves for positioning also differ. Accordingly, there is also a need to arrange the positioning pins of the transport apparatus such that the positioning pins align with the engaging grooves provided in the storage containers. Taking FOUPs as an example, in the case of a FOUP for storing semiconductor wafers having a diameter of 300 mm and a FOUP for storing semiconductor wafers having a diameter of 450 mm, the sizes of the FOUPs differ and the arrangements of the grooves also differ. Accordingly, with regard also to the transport systems that transport and store the storage containers, separate transport systems in accordance with the sizes of the containers have come to be used (e.g., refer to JP-A-2003-142551).

SUMMARY OF THE INVENTION

As discussed above, there is a need to prepare a storage warehouse, a transport system, and the like in accordance with the sizes of articles, and consequently, if articles of differing sizes are handled within the same facility, then there are problems in which the configuration of the apparatus becomes complicated and the cost increases.

Preferred embodiments of the present invention enable the handling of articles of differing sizes by the same system and enable the storage of articles of differing sizes in the same storage warehouse.

Various elements, characteristics, features and aspects of various preferred embodiments of the present invention described below can be arbitrarily combined as needed.

A storage warehouse according to a first aspect of various preferred embodiments of the present invention includes a storage, a port, a transport apparatus, a buffer, and a transfer apparatus. A first article and a second article are stored in the storage. The second article has a shape or size that differs from that of the first article and is capable of being transported while placed on an attachment. The storage includes a shelf whereon the first article or the second article placed on the attachment can be placed. The first article or the second article placed on the attachment is placed on the port in order to enter the first article or the second article placed on the attachment into the storage and/or in order to remove the first article or the second article placed on the attachment from the storage. The transport apparatus transports the first article or the second article placed on the attachment between the storage and the port. The buffer temporarily stores the attachment. The transfer apparatus transfers the attachment between the buffer and the port.

In this case, when the second article is placed on the attachment, the attachment is similar to the first article in shape and size.

If the second article is to be entered into the warehouse, then the second article that has been transported from another apparatus is placed onto the attachment that has been placed on the port in advance. Furthermore, the attachment placed on the port in advance is, for example, transferred by the transfer apparatus from, for example, the buffer. Afterward, in the state wherein the second article is placed on the attachment, the second article is entered into the warehouse by the transport apparatus, i.e., from the port to the shelf inside the storage.

If the second article is to be removed from the warehouse, then the second article disposed on the shelf of the storage is removed from the warehouse by the transport apparatus, i.e., from the shelf to the port, in the state wherein the second article is placed on the attachment. Afterward, the second article removed from the warehouse is transported to another apparatus and the attachment remains on the port. The attachment remaining on the port is transferred by the transfer apparatus to the buffer.

As described above, the transfer of the attachment between the buffer and the port is performed easily by the transfer apparatus and the buffer. As a result, the first article and the second article placed on the attachment is able to be handled in the same manner using the shelf, the port, and the transport apparatus in common.

The storage warehouse may include a controller or control circuitry that controls the transport apparatus. In this case, the controller or control circuitry, in order move the second article into the warehouse, may cause the transport apparatus to transport the second article placed on the attachment from the port to the storage.

The controller or control circuitry, in order to remove the second article from the warehouse, may cause the transport apparatus to transport the second article placed on the attachment from the storage to the port.

The storage warehouse may further include a second transport apparatus that transports the attachment between the storage and the buffer.

In this case, it becomes possible for the second transport apparatus to transport the attachment stored in the buffer to the storage and to house the attachment on the shelf of the storage.

In addition, the attachment is capable of being stacked to a plurality of levels; and the attachments stored in the buffer are able to be stacked to a prescribed number of levels, or below, not exceeding the height of the first article.

In this case, the attachments are stacked to a prescribed number of levels such that the shape or size thereof becomes the same as that of the first article, and thus the attachments are able to be transported between the buffer and the storage by the second transport apparatus in the same manner as the first article.

According to various preferred embodiments of the present invention, it is possible to handle articles of differing sizes by the same system and to store articles of differing sizes in the same storage warehouse.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
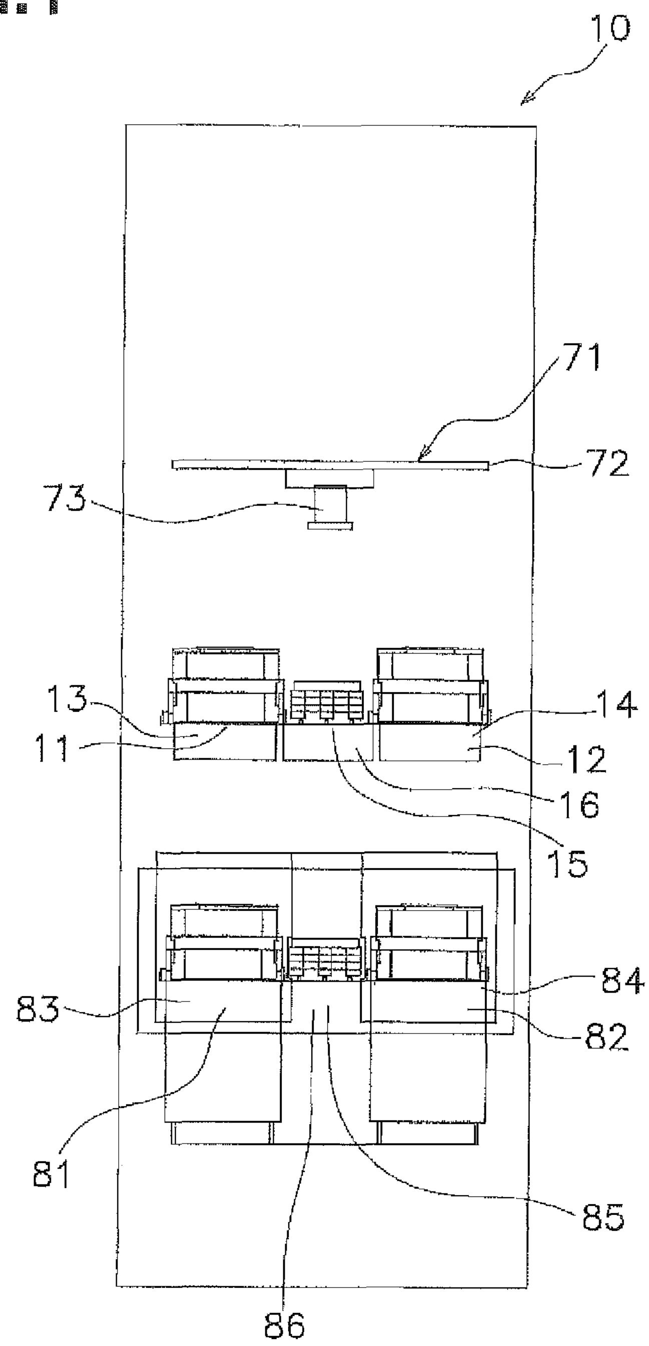
FIG. 1 is a front view of a storage warehouse.
Figure 2:
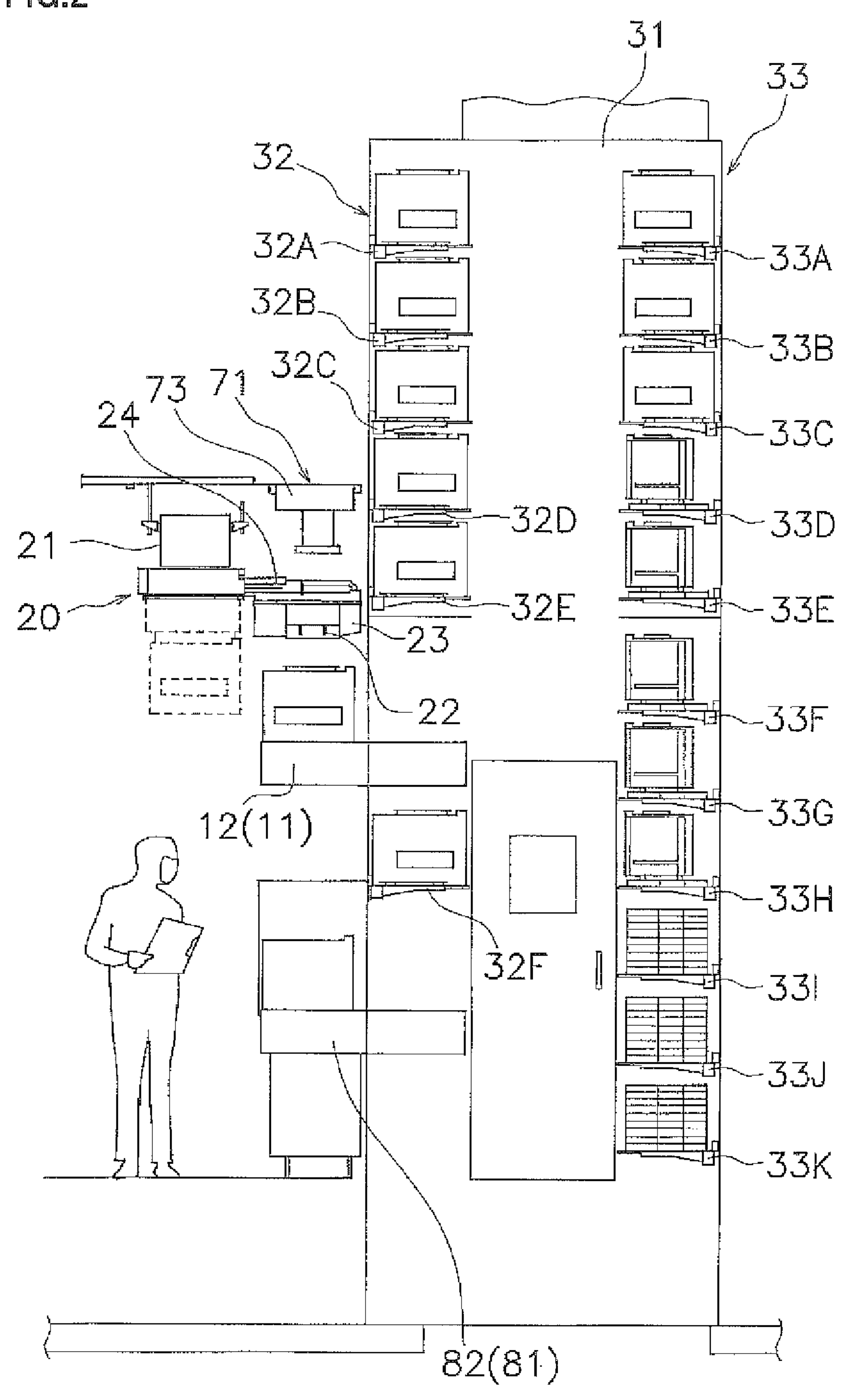
FIG. 2 is a side view of the storage warehouse.
Figure 3:
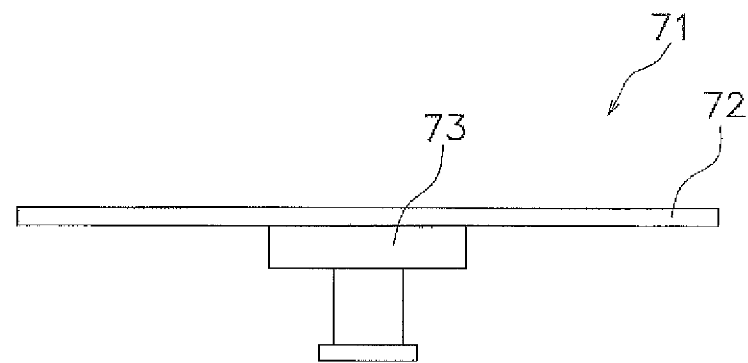
FIG. 3 is an enlarged front view of the principal elements of the storage warehouse.
Figure 3:
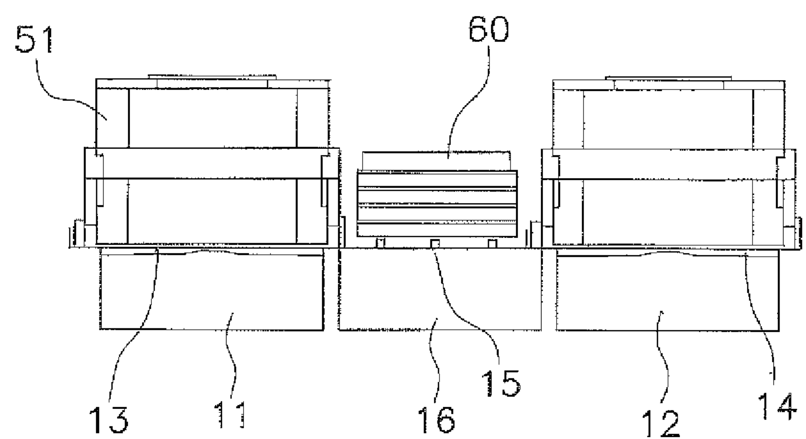
Figure 4:
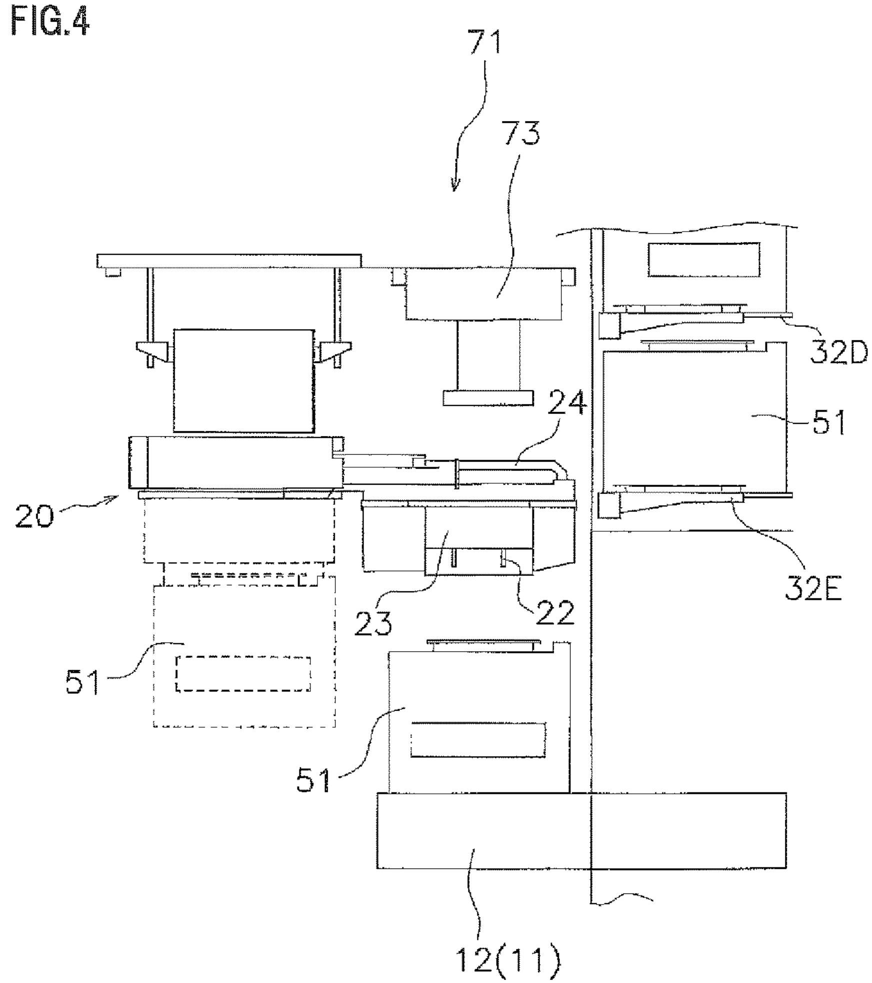
FIG. 4 is an enlarged side view of the principal elements of the storage warehouse.

FIG. 1 is a front view of a storage warehouse, FIG. 2 is aside view of the storage warehouse, FIG. 3 is an enlarged front view of the principal elements of the storage warehouse, and FIG. 4 is an enlarged side view of the principal elements of the storage warehouse.

A storage warehouse 10 according to a preferred embodiment of the present invention includes a warehouse-in port 11, which enables articles to enter into the warehouse from outside, and a warehouse-out port 12, which enables the articles to be removed from the warehouse to outside.

The articles entered into and removed from the storage warehouse 10 are transported using a transport vehicle 20, such as an overhead-travelling-type Overhead Hoist Transport (OHT) vehicle as shown in FIG. 2. When entering the articles into or removing the articles from the warehouse, the transport vehicle 20 travels along a track 21, such as a rail, installed on a ceiling or in the vicinity of the ceiling of a semiconductor device manufacturing facility or the like, and the travel as well as the entering of the articles into and removing the articles from the warehouse are performed based on signals from a controller or control circuitry 91 (discussed later).

The transport vehicle 20 includes a gripper 22 that holds the article; a hoist 23 that raises and lowers the gripper 22; and a cross-feeder 24 that transfers the gripper 22 and the hoist 23 to the side of the track 21.

When entering the article into the warehouse, the transport vehicle 20, in a state wherein the article to be entered into the warehouse is held by the gripper 22, stops at a position corresponding to the warehouse-in port 11 of the storage warehouse 10. The transport vehicle 20 moves the hoist 23 and the gripper 22 to the side of the warehouse-in port 11 using the cross-feeder 24 and positions the article to be held directly above the warehouse-in port 11. Furthermore, the transport vehicle 20, using the hoist 23, lowers the article held by the gripper 22 and places the article onto the warehouse-in port 11 of the storage warehouse 10.

The warehouse-in port 11 is provided with a warehouse-in conveyor 13, and this warehouse-in conveyor 13 conveys the article placed on the warehouse-in port 11 to the interior of the storage warehouse 10.

When removing the article from the storage warehouse 10, the transport vehicle 20 stops at a position corresponding to the warehouse-out port 12 based on a signal from the controller or control circuitry 91. The warehouse-out port 12 is provided with a warehouse-out conveyor 14, and this warehouse-out conveyor 14 conveys the article from the interior of the storage warehouse 10 to the warehouse-out port 12.

Thereafter, the transport vehicle 20, using the cross-feeder 24, moves the hoist 23 and the gripper 22 to the warehouse-out port 12 side and furthermore, using the hoist 23, lowers the gripper 22 to directly above the article on the warehouse-out port 12. The transport vehicle 20 causes the article to be held by the gripper 22 and then raises the gripper 22 by the hoist 23 and, using the cross-feeder 24, moves the hoist 23 and the gripper 22 to directly below the track 21. Thereafter, the transport vehicle 20 travels along the track 21, thus completing the warehouse-out process.

In the storage warehouse 10, a storage houses articles inside a storage-warehouse main body 31, the external appearance of which includes a casing or a frame, and a plurality of shelves 32, 33 are arranged in the storage. Here, the plurality of shelves denotes shelf columns having a plurality of placement surfaces arranged in one or a plurality of columns in the vertical direction. The storage warehouse 10 can be one wherein, for example, m levels (where m is a natural number of 2 or greater) are arranged in the vertical direction, n columns (where n is a natural number of 1 or greater) are arranged in the horizontal direction, and o columns (where o is a natural number of 1 or greater) are arranged in the horizontal direction (hereinbelow, the thickness direction) perpendicular or substantially perpendicular thereto. In the example illustrated, the shelf 32 of prescribed levels×prescribed columns is provided on the surface side whereon the warehouse-in port 11 and the warehouse-out port 12 are provided, and the shelves 33 of prescribed levels×prescribed columns is provided on the surface opposing the surface whereon the warehouse-in port 11 and the warehouse-out port 12 are provided.

A storage-warehouse-internal transport apparatus, such as a stacker crane (not shown), is provided between the shelves 32 and the shelves 33 inside the storage warehouse 10 in order to transfer the articles between the shelves, and the transfer of the articles is able to be performed between the shelves and the warehouse-in port 11 or the warehouse-out port 12, as well as between the shelves.

The article transported by the transport vehicle 20 is moved by the warehouse-in conveyor 13 onto the shelf 32 adjacent to the warehouse-in port 11 and, furthermore, is housed by the storage-warehouse-internal transport apparatus on a prescribed shelf among the plurality of shelves 32, 33.

Here, two types of articles of differing sizes are entered into and removed from the storage warehouse 10.

Here, as one non-limiting example, a FOUP that is a storage container housing semiconductor wafers having a diameter of 450 mm and a FOUP that is a storage container housing semiconductor wafers having a diameter of 300 mm serve as the articles that are entered into and removed from the warehouse.

Consequently, the shelves 32, 33 of the storage warehouse 10 are set to a size that is capable of housing the FOUP that houses the 450-mm semiconductor wafers, and the OHT of the transport vehicle 20 likewise supports FOUPs for 450-mm semiconductor wafers.

Figure 5A:
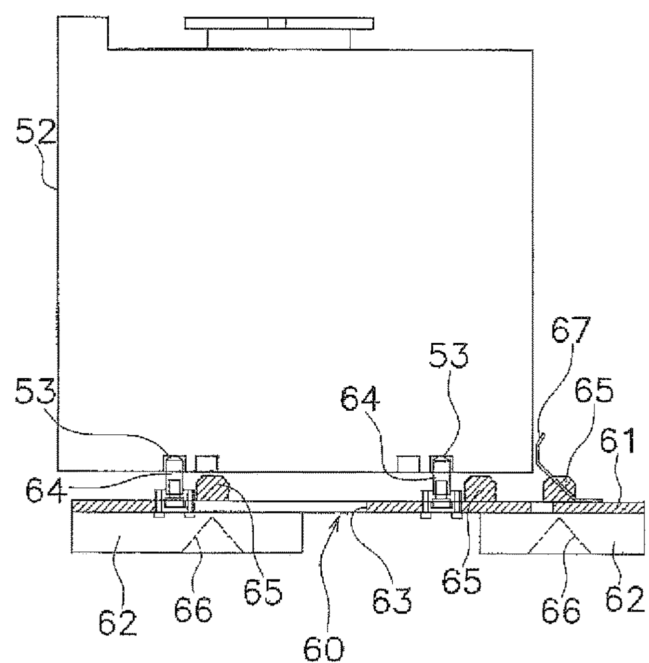
FIG. 5A is a side view of a container.
Figure 5B:
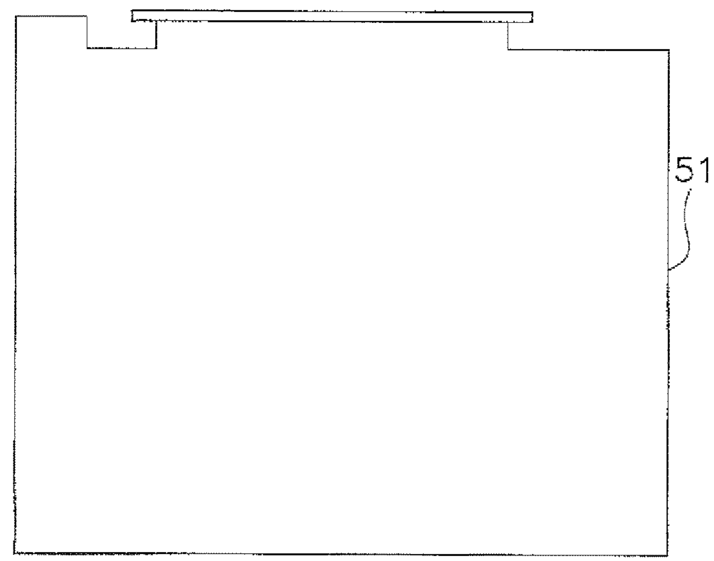
FIG. 5B is a side view of a container.

FIG. 5A and FIG. 5B are side views of containers.

Here, the FOUP that houses the semiconductor wafers having a diameter of 450 mm is a first container 51, and the FOUP that houses the semiconductor wafers having a diameter of 300 mm is a second container 52, for example. As shown in FIG. 5A and FIG. 5B, compared with the first container 51, the second container 52 has a smaller overall shape. In addition, as shown in FIG. 5A and FIG. 5B, the second container 52 is placed on an attachment 60, and thus the size of the second container 52 is substantially the same as the first container 51, at least in the height direction.

The attachment 60 is a member that enables the placement of the second container 52 on various placement structures, the same as is done with the first container 51, by virtue of having the second container 52 placed on the attachment 60 and the implementation of a bottom surface that effects the same function as that of the first container 51.

Figure 6A:
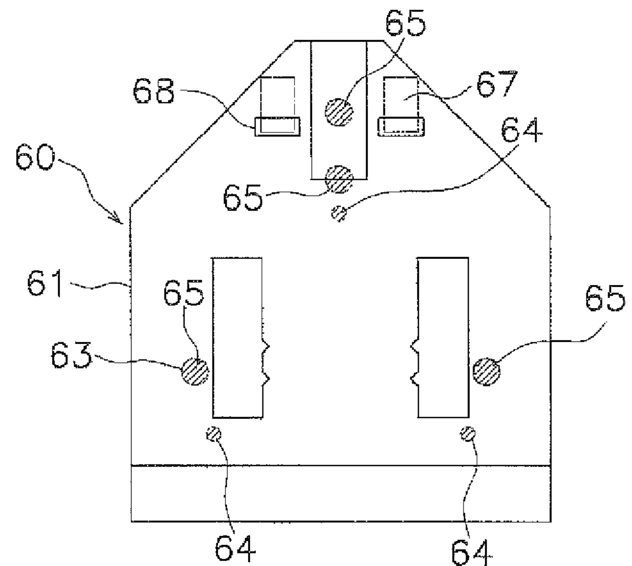
FIG. 6A is an explanatory diagram of an attachment.
Figure 6B:
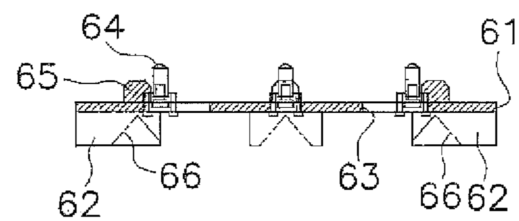
FIG. 6B is an explanatory diagram of the attachment.
Figure 6C:
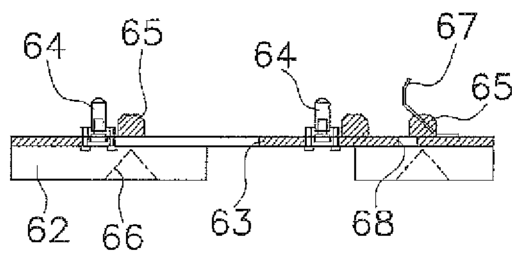
FIG. 6C is an explanatory diagram of the attachment.

FIG. 6A to FIG. 6C are explanatory diagrams of the attachment, wherein FIG. 6A is a plan view thereof, FIG. 6B is a front view thereof, and FIG. 6C is a side view thereof.

As shown in FIG. 6A to FIG. 6C, the attachment 60 has a flat-plate-shaped base 61, protrusions 62, a transfer opening 63, 300-mm-use kinematic pins 64, positioning protrusions 65, and a hook member 67.

The protrusions 62 of the attachment 60 protrude from a lower surface of the base 61, and engaging grooves 66 engage with 450-mm-use kinematic pins (not shown) provided in the warehouse-in conveyor 13, the warehouse-out conveyor 14, the shelves 32, 33, etc.

The 300-mm-use kinematic pins 64 are provided on an upper surface of the base 61 at positions corresponding to positioning holes 53 provided in the second container 52 that houses the 300-mm semiconductor wafers.

The positioning protrusions 65 are provided on the upper surface of the attachment 60 at positions corresponding to the engaging grooves 66. When a plurality of the attachments 60 are stacked, the attachments 60 are positioned by the engagement of the positioning protrusions 65 and the engaging grooves 66.

The hook member 67 is provided on an upper surface of the attachment 60 and, when the second container 52 is placed on the attachment 60, the second container 52 is prevented from coming off by virtue of the hook member 67 making contact with a side surface of the second container 52. In addition, a through hole 68, through which the hook member 67 is able to be inserted when the attachments 60 are stacked, is provided in the base 61, and thus the stacked attachments 60 are able to be prevented from collapsing.

The transfer opening 63 is held by a transfer apparatus 71, which is discussed later, and, for example, includes two openings through which two arms of the gripper 22 are able to be inserted.

If the second container 52 is placed on the attachment 60, then the 300-mm-use kinematic pins 64 engage with the positioning holes 53 of the second container 52. The engaging grooves 66, which define and function as connectors that are capable of engaging with the 450-mm-use kinematic pins, are provided in a lower portion of the attachment 60, and therefore the second container 52 placed on the attachment 60 is able to be handled in the same manner as the first container 51 for the 450-mm semiconductor wafers.

As shown in FIGS. 1-4, the storage warehouse 10 includes an attachment-use warehouse-in/out port 16 located between the warehouse-in port 11 and the warehouse-out port 12. The attachment-use warehouse-in/out port 16 defines a buffer that temporarily stores the attachments 60 and includes an attachment conveyor 15 to enter the attachments 60 into and remove the attachments 60 from the storage warehouse 10.

The transfer apparatus 71, which transfers the attachments 60, is provided such that it is located above the warehouse-in port 11, the warehouse-out port 12, and the attachment-use warehouse-in/out port 16.

The transfer apparatus 71 includes a rail 72 and a transfer machine 73 that is capable of moving along the rail 72. The transfer machine 73 includes a hoist that is capable of moving in the up-down directions and, at a tip of the hoist, a gripper (not shown) that is capable of holding the attachment 60.

When transferring the attachment 60, the transfer machine 73 lowers the hoist, inserts the gripper into the transfer openings 63 of the attachment 60, and thus holds the attachment 60 by scooping it up. Furthermore, the transfer machine 73 is at least capable of integrally moving a prescribed number of the attachments 60 stacked on the attachment-use warehouse-in/out port 16, and also is capable of moving just the one attachment 60 that is located at the uppermost level.

If the article to be entered into the storage warehouse 10 is the second container 52, then the transfer machine 73 is used to move just one of the attachments 60 on the attachment-use warehouse-in/out port 16 onto the warehouse-in port 11.

In addition, after the second container 52 has been removed from the storage warehouse 10, the transfer machine 73 is used to move the remaining attachment 60 on the warehouse-out port 12 onto the attachment-use warehouse-in/out port 16.

The number of levels of the attachments 60 stacked on the attachment-use warehouse-in/out port 16 is able to be set to a prescribed number or below that constitutes a height equivalent to that of the first container 51.

Figure 7:
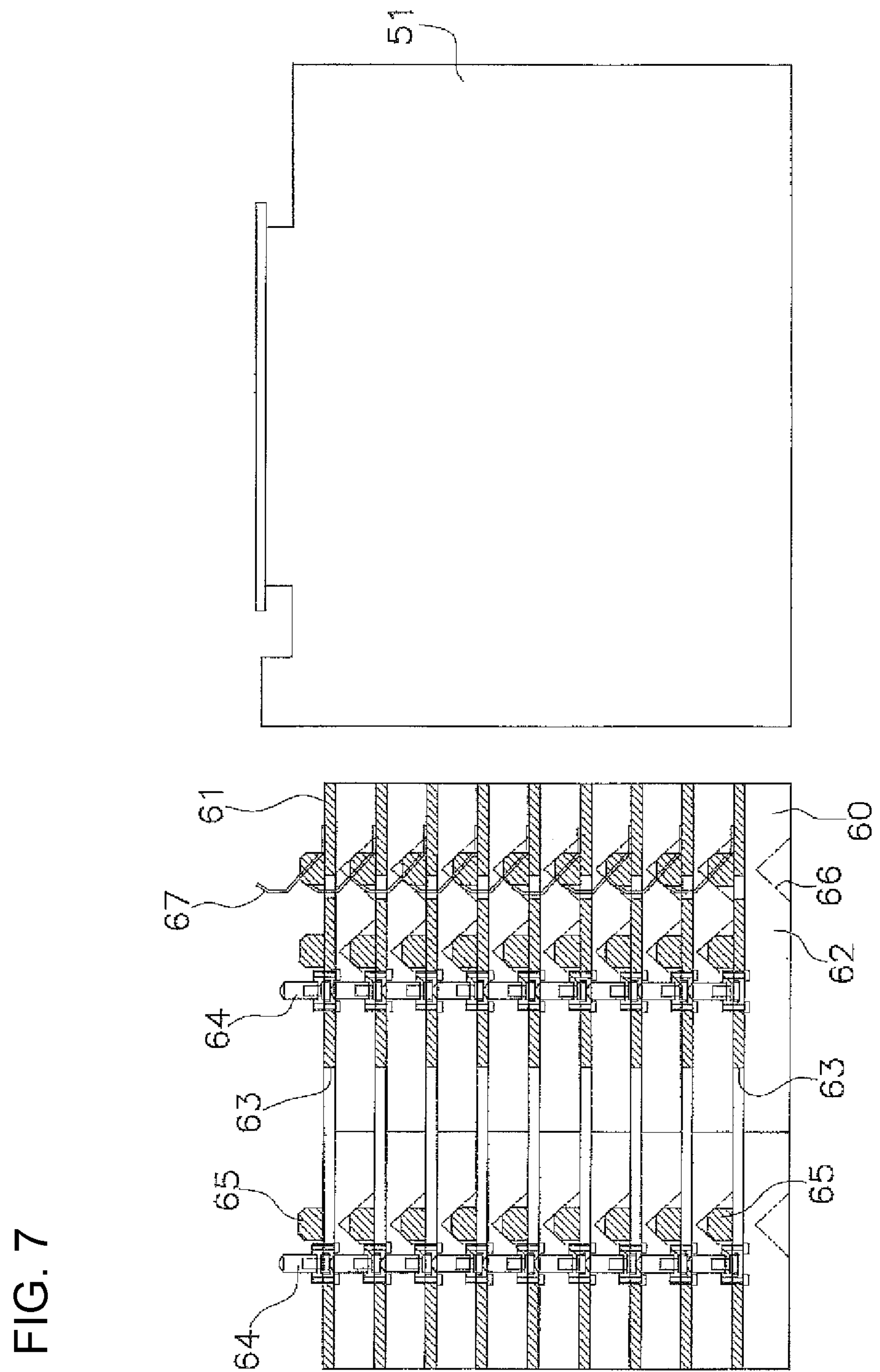
FIG. 7 is an explanatory diagram of the attachments in a stacked state.

FIG. 7 is an explanatory diagram of the attachments in a stacked state.

As shown in FIG. 7, the plurality of attachments 60 are stacked such that the positioning protrusions 65 of each attachment 60 located below engage with the engaging grooves 66 of the attachment 60 located above. At this time, the hook member 67 of each attachment 60 located below is inserted through the through hole 68 of the attachment 60 located above.

In the illustrated example, a height that is the same or substantially the same as that of the first container 51 is reached by the stacking of nine of the attachments 60.

If the state is obtained wherein nine of the attachments 60 are stacked on the attachment-use warehouse-in/out port 16, then, using the attachment conveyor 15, the attachments 60 are able to be housed on the shelves 32 inside the storage warehouse 10.

In addition, the attachments 60 housed in the shelves 32, 33 inside the storage warehouse 10 in the stacked state are able to be removed from the storage warehouse 10 using the attachment conveyor 15.

Furthermore, as shown in FIG. 1 to FIG. 2, the storage warehouse 10 can include a warehouse-in port 81 and a warehouse-out port 82 through which an operator is able to manually enter articles into and remove articles from the warehouse. The warehouse-in port 81 can include a warehouse-in conveyor 83 that moves the articles placed on the warehouse-in port 81 to the shelves 32 inside the storage warehouse 10. In addition, the warehouse-out port 82 can include a warehouse-out conveyor 84 that removes articles from the warehouse, i.e., from the shelves 32 inside the storage warehouse 10 to the warehouse-out port 82.

Furthermore, an attachment-use warehouse-in/out port 86 can be provided between the warehouse-in port 81 and the warehouse-out port 82. The attachment-use warehouse-in/out port 86 constitutes a storage, whereon one or a plurality of the attachments 60 are temporarily placed in a stacked state, and includes an attachment conveyor 85 that enters into or removes from the storage warehouse 10 the attachments 60 stacked to a prescribed number of levels.

In the example shown in FIG. 2, the shelves 32 of a plurality of levels are provided inside the storage warehouse 10 on the surface on which the warehouse-in port 11 and the warehouse-out port 12 are provided, and the levels of the shelves 32 are designated as shelves 32A-32F. In addition, the shelves 33 of a plurality of levels are provided inside the storage warehouse 10 on the surface opposing the warehouse-in port 11 and the warehouse-out port 12, and the levels of the shelves 33 are designated as shelves 33A-33K. A stacker crane 95 (FIG. 20) is disposed between the shelves 32A-32F and the shelves 33A-33K, which enables the transfer of the articles between the shelves.

The shelves 32A-32F, 33A-33K preferably have a size that is capable of housing the first container 51, which corresponds to the 450-mm semiconductor wafers, the second container 52 placed on the attachment 60, the attachments 60 stacked to a number of prescribed levels, and the like.

In the illustrated example, the shelves 32A-32F house the first containers 51, the shelves 33A-33C house the first containers 51, the shelves 33D-33H house the second containers 52 placed on the attachments 60, and the shelves 33I-33K house the stacked attachments 60.

Figure 8:
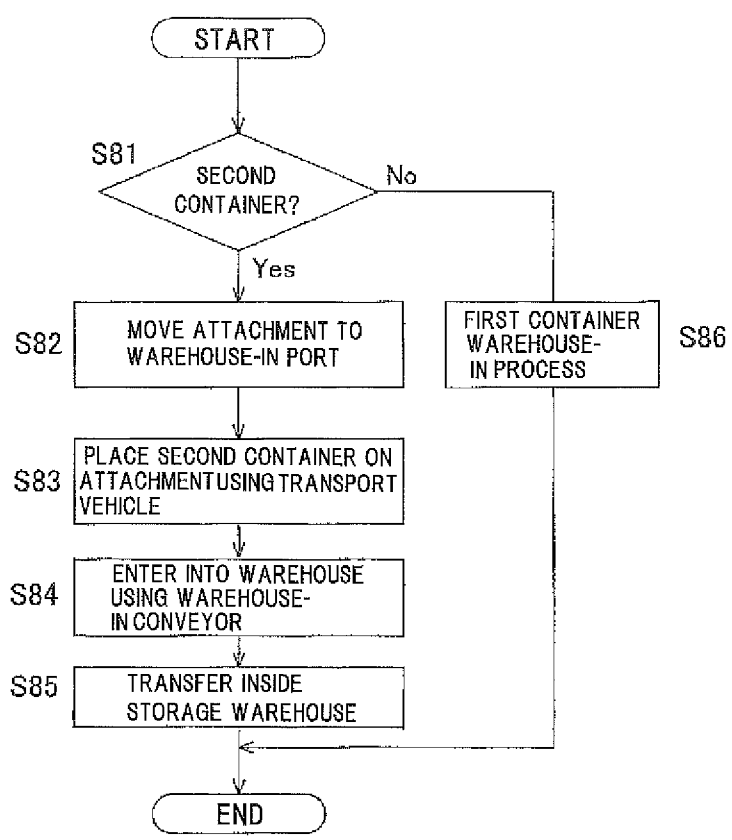
FIG. 8 is a flowchart of a warehouse-in process for a second container.

FIG. 8 is a flowchart of a warehouse-in process for a second container, and FIG. 9A to FIG. 9F are explanatory diagrams of the warehouse-in process for the second container. The explanation will be given assuming that, as discussed above, FOUPs that house semiconductor wafers having a diameter of 450 mm serve as the first containers 51 and FOUPs that house semiconductor wafers having a diameter of 300 mm serve as the second containers 52, for example.

Figure 20:
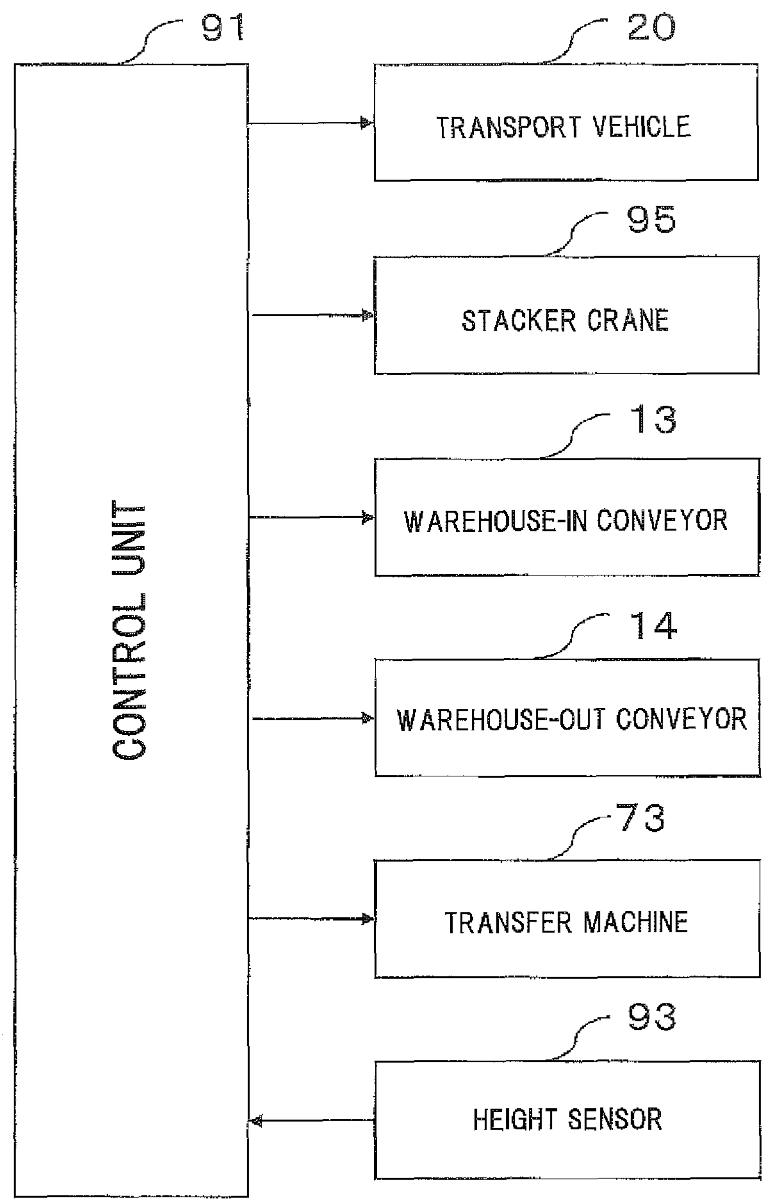
FIG. 20 is a block diagram that shows the configuration of the controller or control circuitry of the storage warehouse.

As shown in FIG. 20, the storage warehouse 10 includes a controller or control circuitry 91 that is programmed or configured to include: a transport instruction unit (not shown) that receives transport instructions, a vehicle controller (not shown) that controls the transport vehicle 20, and a stacker controller (not shown) that controls each element and portion of the storage warehouse 10. FIG. 20 is a block diagram that shows the control configuration of the storage warehouse. Furthermore, in FIG. 20, the controller or control circuitry is drawn as one block but includes the plurality of controllers described above. Each controller may be a computer having a CPU and memory, and/or control circuitry such as an IC or ICs, or LSI, etc., for example.

In step S81, the controller or control circuitry 91 determines whether the article to be entered into the warehouse is the second container 52. The controller or control circuitry 91 determines whether the article to be entered into the warehouse is the second container 52 based on: the data contained in a warehouse-in instruction if a warehouse-in instruction is received from the transport instruction unit or the like; or, the data read from a bar code or the like affixed to the article. Here, the second container 52 can be taken to be a 300-mm FOUP, for example.

If the controller or control circuitry 91 determines that the article to be entered into the warehouse is the second container 52, then the process transitions to step S82. In addition, if the controller or control circuitry 91 determines that the article to be entered into the warehouse is not the second container 52, then the process transitions to step S86.

Figure 9A:
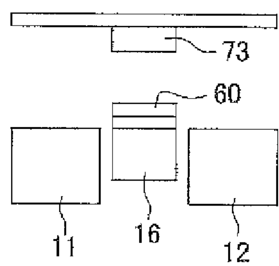
FIG. 9A is an explanatory diagram of the warehouse-in process for the second container.

Here, as shown in FIG. 9A, it is assumed that at least one of the attachments 60 is placed on the attachment-use warehouse-in/out port 16.

In step S82, the attachment 60 placed on the attachment-use warehouse-in/out port 16 is moved to the warehouse-in port 11 using the transfer machine 73.

Figure 9B:
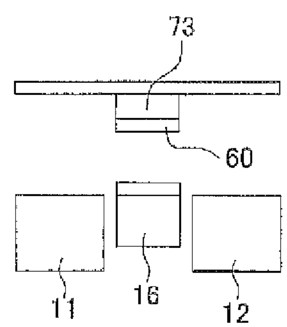
FIG. 9B is an explanatory diagram of the warehouse-in process for the second container.
Figure 9C:
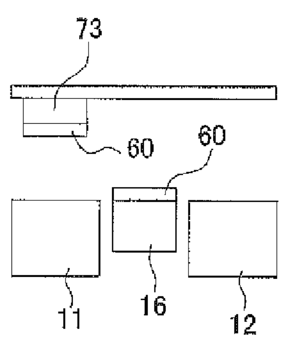
FIG. 9C is an explanatory diagram of the warehouse-in process for the second container.

For example, the controller or control circuitry 91 moves the transfer machine 73 to above the attachment-use warehouse-in/out port 16, inserts the gripper into the transfer openings 63 of the attachment 60, lowers the hoist so as to hold one of the attachments 60, and subsequently raises the hoist, as shown in FIG. 9B.

Figure 9D:
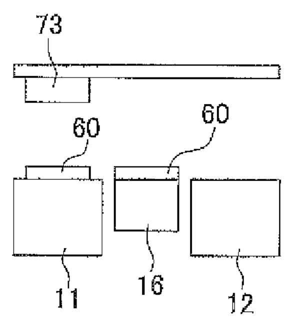
FIG. 9D is an explanatory diagram of the warehouse-in process for the second container.

Subsequently, the controller or control circuitry 91 causes the transfer machine 73 to move to above the warehouse-in port 11 (FIG. 9C), lowers the hoist, and subsequently places the attachment 60 on the warehouse-in port 11 by releasing the holding of the attachment 60 by the gripper (FIG. 9D).

Figure 9E:
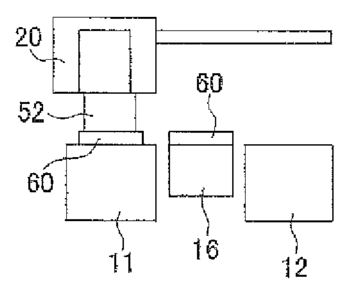
FIG. 9E is an explanatory diagram of the warehouse-in process for the second container.

In step S83, the controller or control circuitry 91 causes the transport vehicle 20 to transport the second container 52 and to place the second container 52 onto the attachment 60 on the warehouse-in port 11 (FIG. 9E). At this time, the transport vehicle 20 places the second container 52 onto the attachment 60 on the warehouse-in port 11 by using the cross-feeder 24 to move the hoist 23 and the gripper 22 from the position immediately below the track 21 to the position immediately above the warehouse-in port 11.

As discussed above, if the second container 52 is a 300-mm FOUP, then the 300-mm-use kinematic pins 64, which are provided on the upper surface of the attachment 60, and the positioning holes 53 of the second container 52 engage, thus making it possible to handle the second container 52 placed on the attachment 60 in the same manner as the first container 51.

Figure 9F:
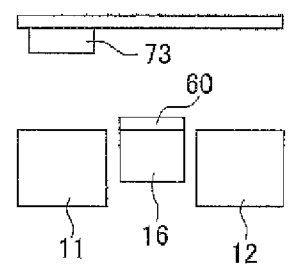
FIG. 9F is an explanatory diagram of the warehouse-in process for the second container.

In step S84, the controller or control circuitry 91 causes the warehouse-in conveyor 13 provided on the warehouse-in port 11 to enter the second container 52 placed on the attachment 60 into the storage warehouse 10 (FIG. 9F). The second container 52 entered into the storage warehouse 10 is in the state wherein the second container 52 is placed on the attachment 60 as is and is housed in the shelves 32, 33 in this state even inside the storage warehouse 10.

In step S85, the controller or control circuitry 91 causes the stacker crane 95 (FIG. 20) inside the storage warehouse 10 to transfer the second container 52 placed on the attachment 60.

In step S86, the controller or control circuitry 91 performs the process of entering the first container 51 into the storage warehouse 10.

Figure 10:
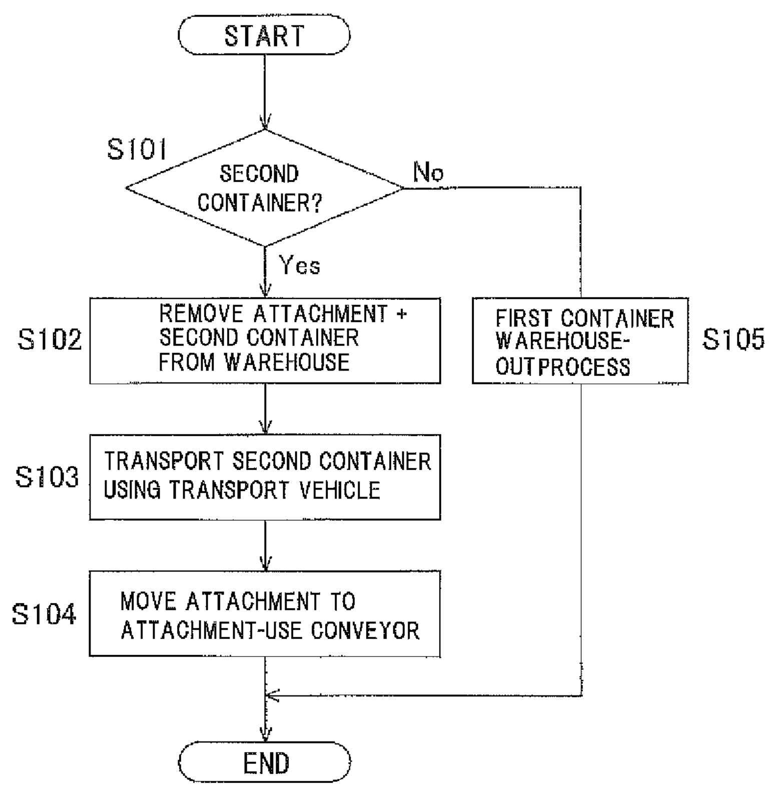
FIG. 10 is a flow chart of a warehouse-out process for the second container.

FIG. 10 is a flow chart of a warehouse-out process for a second container, and FIG. 11A to FIG. 11E are explanatory diagrams of the warehouse-out process for the second container.

In step S101, the controller or control circuitry 91 determines whether the article to be removed from the warehouse is the second container 52. The controller or control circuitry 91 determines whether the article to be removed from the warehouse is the second container 52 based on: the data contained in a warehouse-out instruction if a warehouse-out instruction is received from the transport instruction unit or the like; or, the data read from a bar code or the like affixed to the article.

If the controller or control circuitry 91 determines that the article to be removed from the warehouse is the second container 52, then the process transitions to step S102. In addition, if the controller or control circuitry 91 determines that the article to be entered into the warehouse is not the second container 52, then the process transitions to step S105.

Figure 11A:
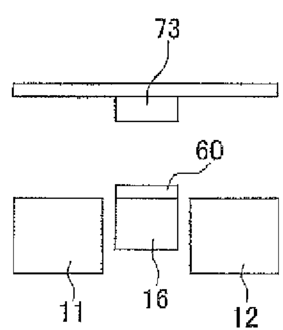
FIG. 11A is an explanatory diagram of the warehouse-out process for the second container.

As shown in FIG. 11A, when removal from the storage warehouse 10 is performed, it is necessary that no other articles or attachment 60 are on the warehouse-out port 12.

Figure 11B:
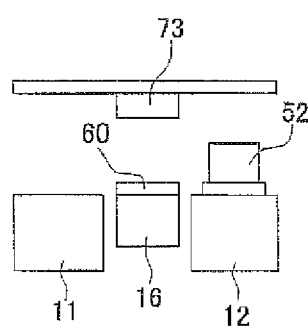
FIG. 11B is an explanatory diagram of the warehouse-out process for the second container.

In step S102, the controller or control circuitry 91 moves the article corresponding to the warehouse-out instruction to the warehouse-out port 12 using the stacker crane 95 inside the storage warehouse 10, and removes the second container 52 placed on the attachment 60 from the storage warehouse 10 using the warehouse-out conveyor 14 (FIG. 11B).

Figure 11C:
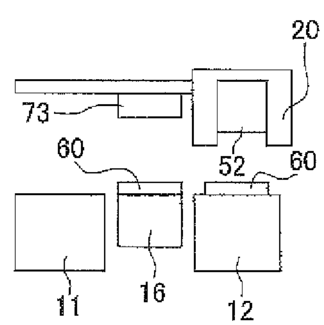
FIG. 11C is an explanatory diagram of the warehouse-out process for the second container.

In step S103, the controller or control circuitry 91 causes the transport vehicle 20 to transport the second container 52. At this time, the transport vehicle 20 uses the cross-feeder 24 to move the hoist 23 and the gripper 22 from the position immediately below the track 21 to the position immediately above the warehouse-out port 12, lowers the gripper 22 using the hoist 23, and holds just the second container 52 using the gripper 22. Subsequently, the transport vehicle 20 raises the gripper 22 using the hoist 23, moves the hoist 23 and the gripper 22 to the position immediately below the track 21 using the cross-feeder 24, and moves to a target location. In so doing, as shown in FIG. 11C, only the attachment 60 remains on the warehouse-out port 12.

Figure 11D:
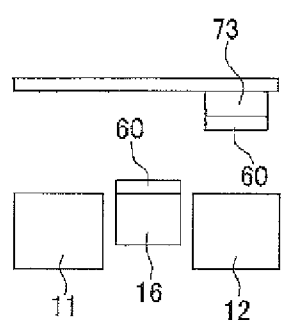
FIG. 11D is an explanatory diagram of the warehouse-out process for the second container.
Figure 11E:
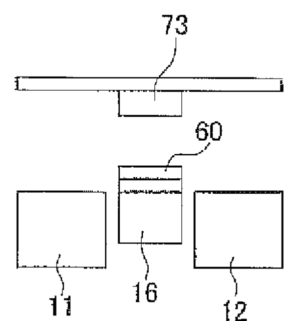
FIG. 11E is an explanatory diagram of the warehouse-out process for the second container.

In step S104, the controller or control circuitry 91 causes the transfer machine 73 to move the remaining attachment 60 on the warehouse-out port 12 onto the attachment-use warehouse-in/out port 16. The controller or control circuitry 91 causes the transfer machine 73 to move to above the warehouse-out port 12, to lower the hoist, holds the attachment 60 using the gripper, and to raise the hoist (FIG. 11D). The controller or control circuitry 91 furthermore causes the transfer machine 73 to move to the attachment-use warehouse-in/out port 16, to lower the hoist, and to place the attachment 60 onto the attachment-use warehouse-in/out port 16 by releasing the hold by the gripper. At this time, if attachments 60 had been placed on the attachment-use warehouse-in/out port 16, then the attachment 60 is stacked (FIG. 11E) by engaging the engaging grooves 66 with the positioning protrusions 65 of the attachment 60 that is located at the uppermost level and inserting the hook member 67 of the attachment 60 located at the uppermost level through the through hole 68. Furthermore, in step S105, the controller or control circuitry 91 performs the process of removing the first container 51 from the storage warehouse 10.

As discussed above, when a prescribed number of the attachments 60 are stacked, the height becomes equal or substantially equal to that of the first container 51, which makes it possible to handle the attachments 60 in the same manner as the first containers 51 as well as to enter the attachments 60 into the storage warehouse 10 and remove the attachments 60 from the storage warehouse 10. Below, the process of entering the attachments 60 stacked to a prescribed number of levels into the storage warehouse 10 will be explained.

Figure 12:
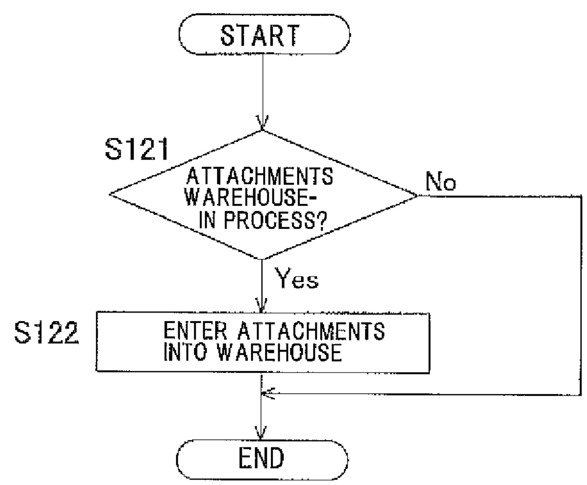
FIG. 12 is a flow chart of the warehouse-in process for the attachments.
Figure 13A:
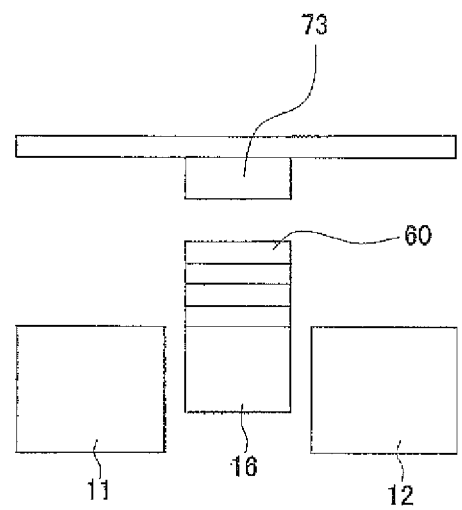
FIG. 13A is an explanatory diagram of the warehouse-in process for the attachments.
Figure 13B:
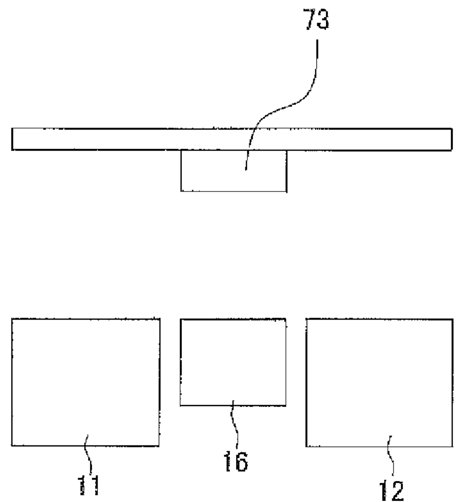
FIG. 13B is an explanatory diagram of the warehouse-in process for the attachments.

FIG. 12 is a flow chart of a warehouse-in process for the attachments, and FIG. 13A to FIG. 13B are explanatory diagrams of the warehouse-in process for the attachments.

In step S121, the controller or control circuitry 91 determines whether to perform the warehouse-in process for the attachments 60.

For example, if the attachment-use warehouse-in/out port 16 includes a height sensor 93 that measures the height of the stacked attachments 60, then the controller or control circuitry 91 determines, in accordance with an output signal of the height sensor 93, whether the attachments on the attachment-use warehouse-in/out port 16 have reached a prescribed number of levels. If the attachments 60 have reached the prescribed number of levels and furthermore the removal of the attachments 60 from the storage warehouse 10 is expected, then the controller or control circuitry 91 performs the warehouse-in process for the attachments 60 stacked to the prescribed number of levels.

In addition, if the controller or control circuitry 91 is controlling the movement of the attachments 60 fully automatically, then the controller or control circuitry 91 determines whether the attachments 60 on the attachment-use warehouse-in/out port 16 have reached the prescribed number of levels by ascertaining the transfer status of the attachments 60 among the warehouse-in port 11, the warehouse-out port 12, and the attachment-use warehouse-in/out port 16. If the attachments 60 have reached the prescribed number of levels and furthermore the removal of the attachments 60 from the storage warehouse 10 is expected, then the warehouse-in process for the attachments 60 stacked to the prescribed number of levels is performed.

Furthermore, if there is an input from the operator that instructs the performance of the warehouse-in process for the attachments 60, then the controller or control circuitry 91 performs the warehouse-in process for the attachments 60.

As shown in FIG. 13A, if the attachments 60 are stacked to a height that is the same or substantially the same as that of the first container 51, then the controller or control circuitry 91 performs the warehouse-in process for the attachments 60. In the example shown in FIG. 7, if nine of the attachments 60 are stacked, then the height becomes the same or substantially the same as that of the first container 51, and therefore the controller or control circuitry 91 enters the nine stacked attachments 60 into the storage warehouse 10.

In step S121, if the controller or control circuitry 91 determines that the warehouse-in process for the attachments 60 is to be performed, then the process transitions to step S122; otherwise, the process terminates.

In step S122, the controller or control circuitry 91 performs the warehouse-in process for the attachments 60 using the attachment conveyor 15 (FIG. 13B). The controller or control circuitry 91 causes the attachment conveyor 15 to enter the stacked attachments 60 into the storage warehouse 10 and subsequently causes the stacker crane 95 inside the storage warehouse 10 to transfer such to the prescribed shelf 32.

If the attachments 60 on the attachment-use warehouse-in/out port 16 have run out, then the operator either supplements the attachments 60 by a manual operation or transports the attachments 60 from the housing part that stores the attachments 60. Here, the process wherein the controller or control circuitry 91 removes from the storage warehouse 10 the attachments 60 housed inside the storage warehouse 10 is explained below, assuming that the attachments 60 stacked to a prescribed number of levels are housed in the shelves 32, 33 inside the storage warehouse 10.

Figure 14:
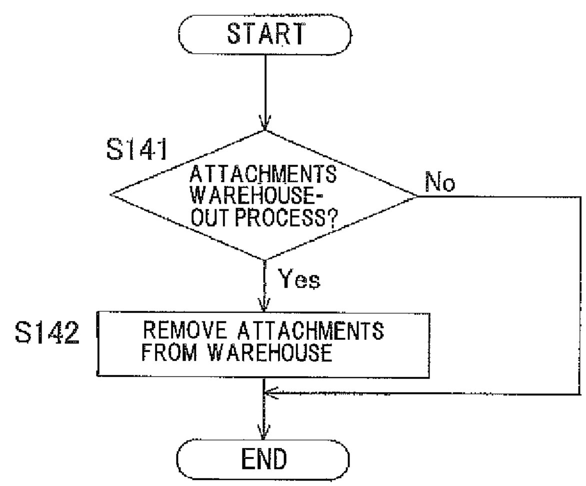
FIG. 14 is a flow chart of the warehouse-out process for the attachments.
Figure 15A:
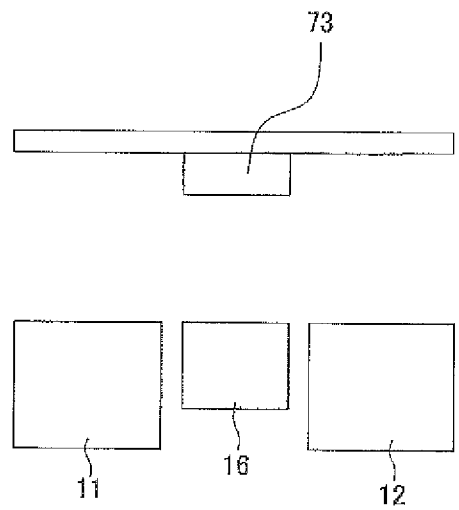
FIG. 15A is an explanatory diagram of the warehouse-out process for the attachments.
Figure 15B:
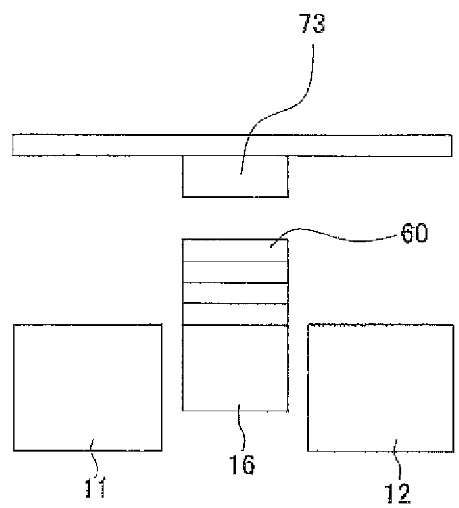
FIG. 15B is an explanatory diagram of the warehouse-out process for the attachments.

FIG. 14 is a flow chart of a warehouse-out process for the attachments, and FIG. 15A to FIG. 15B are explanatory diagrams of the warehouse-out process for the attachments.

In step S141, the controller or control circuitry 91 determines whether to perform the warehouse-out process for the attachments 60.

For example, if the attachment-use warehouse-in/out port 16 includes the height sensor 93 that measures the height of the attachments 60 and if the controller or control circuitry 91 determines, in accordance with the output signal of the height sensor 93, that the attachments 60 on the attachment-use warehouse-in/out port 16 have run out and judges that there are no attachments 60, then the warehouse-out process is performed.

In addition, if the controller or control circuitry 91 is controlling the movement of the attachments 60 fully automatically, then the controller or control circuitry 91 is able to determine whether the attachments 60 on the attachment-use warehouse-in/out port 16 have run out by ascertaining the transfer status of the attachments 60 among the warehouse-in port 11, the warehouse-out port 12, and the attachment-use warehouse-in/out port 16, and performs the warehouse-out process if it is judged that there are no attachments 60.

Furthermore, if there is an input from the operator that instructs the performance of the warehouse-out process for the attachments 60, then the controller or control circuitry 91 performs the warehouse-out process for the attachments 60.

As shown in FIG. 15A, if the attachments 60 on the attachment-use warehouse-in/out port 16 have run out, then the controller or control circuitry 91 performs the warehouse-out process for the attachments 60.

In step S141, if the controller or control circuitry 91 determines that the warehouse-out process for the attachments 60 is to be performed, then the process transitions to step S142; otherwise, the process terminates.

In step S142, the controller or control circuitry 91 performs the warehouse-out process for the attachments 60 using the attachment conveyor 15. The controller or control circuitry 91 causes the stacker crane 95 to transfer the attachments 60 stacked to the prescribed number of levels from the prescribed shelves 32 to the warehouse-out port 12, and causes the warehouse-out conveyor 14 to remove the attachments 60 from the warehouse (FIG. 15B).

Figure 16:
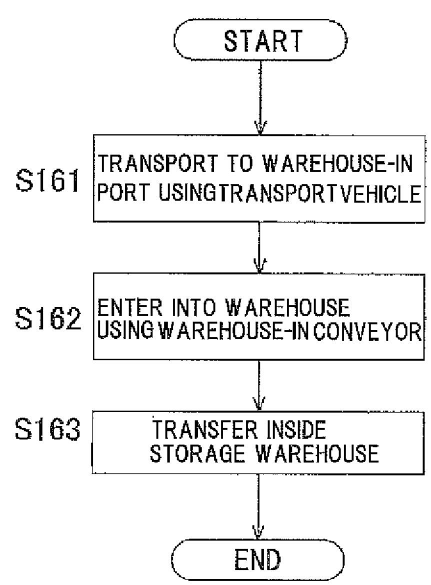
FIG. 16 is a flow chart of the warehouse-in process for a first container.
Figure 17A:
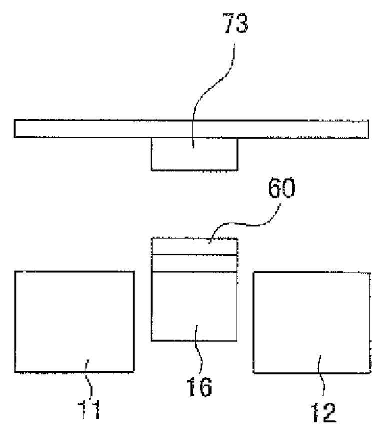
FIG. 17A is an explanatory diagram of the warehouse-in process for the first container.
Figure 17B:
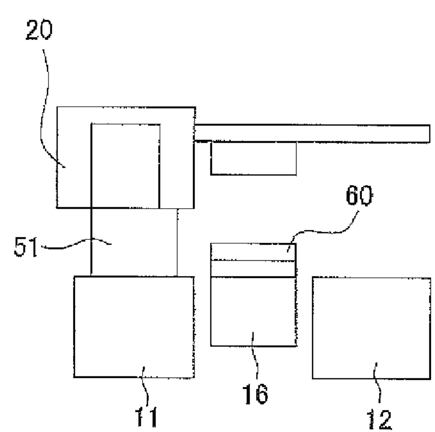
FIG. 17B is an explanatory diagram of the warehouse-in process for the first container.
Figure 17C:
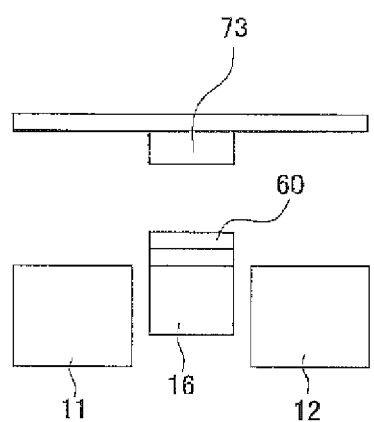
FIG. 17C is an explanatory diagram of the warehouse-in process for the first container.

FIG. 16 is a flow chart of a warehouse-in process for a first container, and FIG. 17A to FIG. 17C are explanatory diagrams of the warehouse-in process for the first container.

In step S161, the controller or control circuitry 91 causes the transport vehicle 20 to transport the first container 51 and to place the first container 51 onto the warehouse-in port 11 (FIG. 17B).

In step S162, the controller or control circuitry 91 causes the warehouse-in conveyor 13 to enter the first container 51 into the storage warehouse 10 (FIG. 17C).

In step S163, the controller or control circuitry 91 causes the stacker crane 95 inside the storage warehouse 10 to transfer the first container 51.

Figure 18:
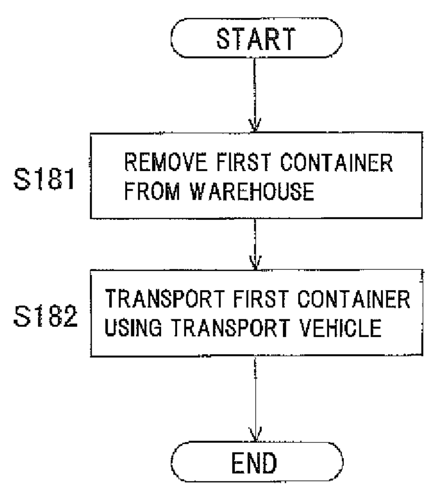
FIG. 18 is a flow chart of the warehouse-out process for the first container.
Figure 19A:
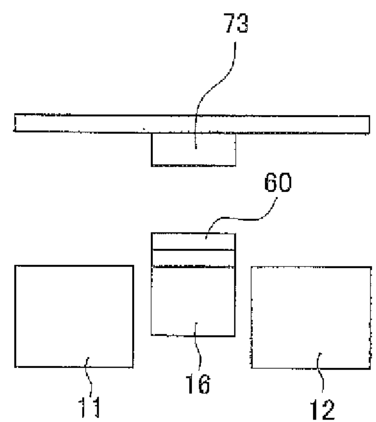
FIG. 19A is an explanatory diagram of the warehouse-out process for the first container.
Figure 19B:
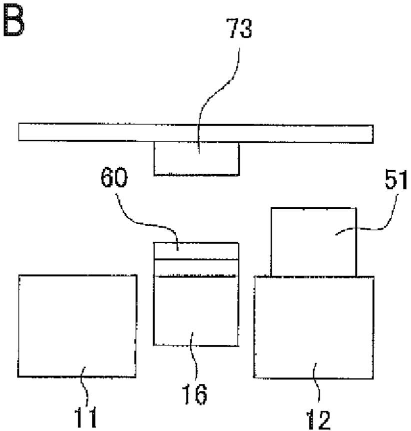
FIG. 19B is an explanatory diagram of the warehouse-out process for the first container.
Figure 19C:
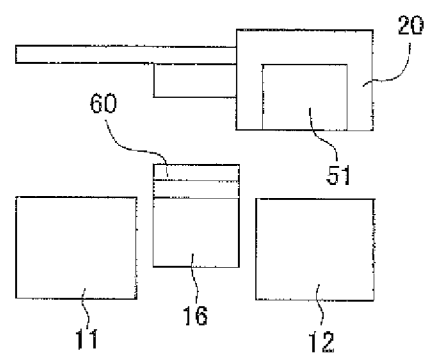
FIG. 19C is an explanatory diagram of the warehouse-out process for the first container.

FIG. 18 is a flow chart of a warehouse-out process for a first container, and FIG. 19A to FIG. 19C are explanatory diagrams of the warehouse-out process for the first container.

In step S181, the controller or control circuitry 91 uses the stacker crane 95 inside the storage warehouse 10 to move the article corresponding to a warehouse-out instruction to the warehouse-out port 12, and uses the warehouse-out conveyor 14 to remove the first container 51 from the storage warehouse 10 (FIG. 19B).

In step S182, the controller or control circuitry 91 causes the transport vehicle 20 to transport the first container 51. At this time, the transport vehicle 20 lowers the hoist, subsequently holds the first container 51 with the gripper, raises the hoist, and moves to a target location (FIG. 19C).

The storage warehouse 10 (one example of the storage warehouse) includes the shelves 32, 33 (one example of the storages), the warehouse-in port 11 and the warehouse-out port 12 (one example of the ports), the warehouse-in conveyor 13 and the warehouse-out conveyor 14 (one example of the transport apparatuses), the attachment-use warehouse-in/out port 16 (one example of the buffer), and the transfer machine 73 (one example of the transfer apparatus).

The first container 51 (one example of a first article) and the second container 52 (one example of a second article) are stored on the shelves 32, 33. The second container 52 differs from the first container 51 in shape or size and is capable of being transported while placed on the attachment 60 (one example of the attachment). The shelves 32, 33 include the shelves 32A-32F, 33A-33K (one example of the shelves) whereon the first containers 51 or the second containers 52 placed on the attachments 60 can be placed. The first container 51 or the second container 52 placed on the attachment 60 is placed on the warehouse-in port 11 or the warehouse-out port 12 in order to be entered into the warehouse, i.e., onto the shelves 32, 33, and/or in order to be removed from the warehouse, i.e., from the shelves 32, 33. The warehouse-in conveyor 13 and the warehouse-out conveyor 14 are capable of conveying the first container 51 or the second container 52 placed on the attachment 60 between the shelves 32, 33 and the warehouse-in port 11 and between the shelves 32, 33 and the warehouse-out port 12. The attachment-use warehouse-in/out port 16 can temporarily store the attachment 60. The transfer machine 73 is capable of transferring the attachment 60 between the attachment-use warehouse-in/out port 16 and the warehouse-in port 11 and between the attachment-use warehouse-in/out port 16 and the warehouse-out port 12.

In the present preferred embodiments of the present invention having the unique structure described above, when the second container 52 is placed on the attachment 60, the attachment 60 is similar to the first container 51 in shape or size.

If the second container 52 is to be entered into the warehouse, then the second container 52 that has been transported from another apparatus is placed onto the attachment 60 that has been placed on the warehouse-in port 11 in advance. Furthermore, the attachment 60 placed on the warehouse-in port 11 in advance is, for example, transferred by the transfer machine 73 from the attachment-use warehouse-in/out port 16 or the warehouse-out port 12 to the warehouse-in port 11. Afterward, in the state wherein the second container 52 is placed on the attachment 60, the second container 52 is entered into the warehouse by the warehouse-in conveyor 13, i.e., from the warehouse-in port 11 to the shelves 32, 33.

If the second container 52 is to be removed from the warehouse, then, in the state wherein the second container 52 disposed on the shelves 32, 33 is placed on the attachment 60, the second container 52 is removed from the warehouse by the warehouse-out conveyor 14, i.e., from the shelves 32, 33 to the warehouse-out port 12. Afterward, the second container 52 removed from the warehouse is transported to another apparatus and the attachment 60 remains on the warehouse-out port 12. The attachment 60 remaining on the warehouse-out port 12 is next transferred by the transfer machine 70 to the attachment-use warehouse-in/out port 16 or the warehouse-in port 11.

As described above, the transfer of the attachment 60 between the attachment-use warehouse-in/out port 16 and the warehouse-in port 11 and between the attachment-use warehouse-in/out port 16 and the warehouse-out port 12 is performed easily by the transfer machine 73 and the attachment-use warehouse-in/out port 16. As a result, the first container 51 and the second container 52 placed on the attachment 60 is able to be handled in the same manner using the shelves 32, 33, the warehouse-in port 11, the warehouse-out port 12, the warehouse-in conveyor 13, and the warehouse-out conveyor 14 in common.

Other Preferred Embodiments

The above explained one preferred embodiment of the present invention, but the present invention is not limited to the above-mentioned preferred embodiment and various modifications are possible within a range that does not depart from the essence of the invention. In particular, the preferred embodiments and modified examples written in the present specification can be arbitrarily combined as needed.

In the preferred embodiment discussed above, the warehouse-in port 11 for entering the articles into the warehouse, and the warehouse-out port 12 to remove the articles from the warehouse, are independently configured, but the warehouse-in port 11 and the warehouse-out port 12 can be constructed as a warehouse-in/out port that is capable of entering articles into the warehouse and removing articles from the warehouse. In such a case, the attachments remaining on the warehouse-in/out port after the second article has been removed from the warehouse may be used as is when the next second article is to be entered into the warehouse. That is, in this case, the attachments remaining on the warehouse-in/out port after the second article has been removed from the warehouse do not need to be transferred from the warehouse-in/out port to the attachment-use warehouse-in/out port. In addition, when the second article is to be entered into the warehouse, the attachment does not need to be transferred from the attachment-use warehouse-in/out port to the warehouse-in/out port.

In addition, in this case, the warehouse-in conveyor 13 and the warehouse-out conveyor 14 likewise can be constructed such that they are actualized using the same warehouse-in/out conveyor.

The preferred embodiment discussed above described an example of an overhead-travelling-type transport vehicle (OHT) that travels along the rail affixed to the ceiling, but the present invention is not necessarily specified as such, and it is possible to adopt a configuration or the like that conveys using a conveyor.

In the preferred embodiment discussed above, the storage warehouse is capable of housing FOUPs that house 450-mm semiconductor wafers as the first containers and, in the same system, FOUPs that house 300-mm semiconductor wafers as the second containers; however, the present invention is structured to handle, in the same system, articles of different sizes but is not limited to the sizes in the preferred embodiment. In this case, the attachments preferably match the sizes of the articles to be used.

Furthermore, the articles stored in the storage warehouse are not limited to storage containers, such as FOUPs that house semiconductor wafers.

The preferred embodiment discussed above disclosed that articles of two different sizes are handled in the same manner by the same system, but it is possible to adopt a configuration such that articles of three or more different sizes are handled by the same system. In this case, the shapes of the shelves inside the storage warehouse are capable of housing the article of the largest size, and, when other articles are to be placed, a plurality of attachments are prepared such that the size of those articles become equal to the article of the largest size. It is possible to perform processing in the same manner as the preferred embodiment discussed above by providing the storage that temporarily stores the attachments and by transferring, between the warehouse-in/out ports, the attachment corresponding to the size of the article to be entered into or removed from the warehouse.

In the preferred embodiments of the present invention, the attachments 60 can be stacked to a plurality of levels and, furthermore, the attachments 60 stored on the attachment-use warehouse-in/out port 16 are stacked to a prescribed number of levels, or below, not exceeding the height of the article of the first container 51. However, the mode of the arrangement of the attachments 60 is not limited to that of the preferred embodiments.

In the preferred embodiments described above, the attachment conveyor 15 is provided as a second transport apparatus that is capable of transporting the attachments 60 between the storage warehouse 10 and the attachment-use warehouse-in/out port 16. However, the attachment conveyor 15 may be omitted.

Various preferred embodiments of the present invention can be widely adapted to automated warehouses that enter into the warehouse and remove from the warehouse articles housed on a plurality of shelves.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A storage warehouse that stores a first article and a second article, the second article having a shape or size different from that of the first article and being transported while placed on an attachment, the storage warehouse comprising:

a storage including a shelf whereon the first article, or the second article placed on the attachment, is capable of being placed;

a port whereon the first article, or the second article placed on the attachment, is placed in order to enter the first article, or the second article placed on the attachment, into the storage and/or in order to remove the first article, or the second article placed on the attachment, from the storage;

a transport apparatus that transports the first article, or the second article placed on the attachment, between the storage and the port;

a buffer that temporarily stores the attachment without the second article being placed on the attachment; and a transfer apparatus that transfers the attachment, without the second article being placed on the attachment, between the buffer and the port; wherein the transfer apparatus transfers the attachment, without the second article being placed on the attachment, from the buffer to the port prior to the second article being placed on the attachment and entered into the storage; and the transfer apparatus transfers the attachment, without the second article being placed on the attachment, from the port to the buffer after the second article is removed from the storage and not placed on the attachment.

2. The storage warehouse according to claim 1, further comprising:

control circuitry that controls the transport apparatus; wherein the control circuitry causes the transport apparatus to transport the second article placed on the attachment from the port to the storage.

3. The storage warehouse according to claim 2, wherein the control circuitry causes the transport apparatus to transport the second article placed on the attachment from the storage to the port.

4. The storage warehouse according to claim 1, further comprising control circuitry that controls the transport apparatus; wherein the control circuitry causes the transport apparatus to transport the second article placed on the attachment from the storage to the port.

5. The storage warehouse according to claim 1, further comprising a second transport apparatus that transports the attachment between the storage and the buffer.

6. The storage warehouse according to claim 2, further comprising a second transport apparatus that transports the attachment between the storage and the buffer.

7. The storage warehouse according to claim 3, further comprising a second transport apparatus that transports the attachment between the storage and the buffer.

8. The storage warehouse according to claim 4, further comprising a second transport apparatus that transports the attachment between the storage and the buffer.

9. The storage warehouse according to claim 1, wherein attachments, including the attachment, are stacked; and the attachments stored in the buffer are stacked to a plurality of levels, or below, not exceeding a height of the first article.

10. The storage warehouse according to claim 2, wherein attachments, including the attachment, are stacked; and the attachments stored in the buffer are stacked to a plurality of levels, or below, not exceeding a height of the first article.

11. The storage warehouse according to claim 3, wherein attachments, including the attachment, are stacked; and the attachments stored in the buffer are stacked to a plurality of levels, or below, not exceeding a height of the first article.

12. The storage warehouse according to claim 4, wherein attachments, including the attachment, are stacked; and the attachments stored in the buffer are stacked to a plurality of levels, or below, not exceeding a height of the first article.

* * * * *